(12) United States Patent
Yamamoto (10) Patent No.: US 7,474,733 B1
(45) Date of Patent: Jan. 6, 2009

(54) OPTICAL ELEMENT SUCH AS MULTILAYER FILM REFLECTION MIRROR, PRODUCTION METHOD THEREFOR AND DEVICE USING IT

(75) Inventor: Masaki Yamamoto, Sendai (JP)

(73) Assignee: Nikon Corporation, Tokyo (JP)

(*) Notice: Subject to any disclaimer, the term of this patent is extended or adjusted under 35 U.S.C. 154(b) by 345 days.

(21) Appl. No.: 09/890,143

(22) PCT Filed: Aug. 18, 2000

(86) PCT No.: PCT/JP00/05571

§ 371 (c)(1),
(2), (4) Date: Jul. 26, 2001

(87) PCT Pub. No.: WO01/41155

PCT Pub. Date: Jun. 7, 2001

(30) Foreign Application Priority Data

Nov. 29, 1999 (JP) ................................. 11-337955

(51) Int. Cl.
*G21K 1/06* (2006.01)
(52) U.S. Cl. ........................................ 378/84; 359/359
(58) Field of Classification Search .................. 378/84, 378/82, 34, 43, 145, 85; 359/359
See application file for complete search history.

(56) References Cited

U.S. PATENT DOCUMENTS

| | | | | |
|---|---|---|---|---|
| 3,887,261 A | * | 6/1975 | Spiller ........................ | 359/580 |
| 4,590,376 A | * | 5/1986 | Smith ........................ | 250/358.1 |
| 4,954,700 A | * | 9/1990 | Trozpek ..................... | 250/201.9 |
| 5,085,957 A | | 2/1992 | Hosono | |
| 5,163,078 A | * | 11/1992 | Iketaki ......................... | 378/85 |
| 5,239,566 A | * | 8/1993 | Nakamura et al. ............. | 378/43 |
| 5,272,744 A | * | 12/1993 | Itou et al. ..................... | 378/35 |
| 5,319,695 A | * | 6/1994 | Itoh et al. ....................... | 378/84 |
| 5,691,541 A | * | 11/1997 | Ceglio et al. .................. | 378/34 |
| 5,745,286 A | * | 4/1998 | Hawryluk ..................... | 359/359 |

(Continued)

FOREIGN PATENT DOCUMENTS

EP 0 279 670 8/1988

(Continued)

OTHER PUBLICATIONS

Voorma et al., "Angular and energy dependence of ion bombardment of Mo/Si multilayers", Journal of Applied Physics, vol. 82, Issue 4, pp. 1876-1881.*

(Continued)

*Primary Examiner*—Chih-Cheng G Kao

(57) ABSTRACT

A multilayer film reflector capable of simply correcting a wavefront phase and a method of forming the reflector are disclosed.

For this purpose, a reflector using reflection by a multilayer film is disclosed. This multilayer film is formed in a number of cycles larger than that necessary to substantially saturate a reflectance, and a wavefront phase of emerging rays is adjusted by cutting away the multilayer film in accordance with an amount of adjustment of the wavefront phase.

Further, the formation of a correction film as well as the formation of a multilayer larger than necessary to substantially saturate the reflectance permits the correction of a phase by cutting away also the multilayer film when the phase cannot be corrected only by cutting away the correction film, whereby the phase can be corrected more accurately.

28 Claims, 10 Drawing Sheets

U.S. PATENT DOCUMENTS

| | | | |
|---|---|---|---|
| 5,911,858 A * | 6/1999 | Ruffner | 204/192.27 |
| 5,935,737 A | 8/1999 | Yan | |
| 5,958,605 A * | 9/1999 | Montcalm et al. | 428/627 |
| 6,028,693 A * | 2/2000 | Fork et al. | 359/248 |
| 6,110,607 A * | 8/2000 | Montcalm et al. | 428/641 |
| 6,160,867 A * | 12/2000 | Murakami | 378/84 |
| 6,235,434 B1 * | 5/2001 | Sweeney et al. | 430/5 |
| 6,295,164 B1 * | 9/2001 | Murakami et al. | 359/584 |
| 6,377,655 B1 * | 4/2002 | Murakami et al. | 378/84 |
| 6,485,153 B2 * | 11/2002 | Ota | 359/859 |

FOREIGN PATENT DOCUMENTS

| | | |
|---|---|---|
| JP | 63-211130 | 9/1988 |
| JP | 4-204603 | 7/1992 |
| JP | 06-180399 | 6/1994 |
| JP | 6-180399 | 6/1994 |
| JP | 11-23796 | 1/1999 |

OTHER PUBLICATIONS

M. Yamamoto, "Sub-nm Figure Error Correction of an EUV Multilayer Mirror by its Surface Milling", 7th International Conference on Synchrontron Radiation Instrumentation, Book of Abstracts (Aug. 21-25, 2000), pp. 1-2.

M. Yamamoto, "Sub-nm figure error correction of an extreme ultraviolet multilayer mirror by its surface milling", Nuclear Instruments and Methods in Physics Research A 467-468 (2001), pp. 1282-1285.

M. Yamamoto and T. Namioka, "Layer-by-layer design method for soft-x-ray multilayers", Applied Optics, vol. 31, No. 10, Apr. 1, 1992, pp. 1622-1630.

J. Braat, "Phase correcting layers in EUV imaging system for microlithography", Proceedings of the OSA TOPS on Extreme Ultraviolet Lithography, Optical Society of America (1996), pp. 152-155.

H. Kinoshita, et al., "Soft x-ray reduction lithography using multilayer mirrors", J. Vac. Sci. Technol. B 7 (6), Nov./Dec. 1989, pp. 1648-1651.

C. Gwyn et al., "Extreme ultraviolet lithography", J. Vac. Sci. Technol. B 16(6), Nov./Dec. 1998, pp. 3142-3149.

R. Stuik, et al., "Peak and integrated reflectivity, wavelength and gamma optimization of MO/Si, and Mo/Be multilayer, multilayer, multielement optics for extreme ultraviolet lithography", J. Vac. Sci. Technol. B 17(6), Nov./Dec. 1999, pp. 2998-3002.

P. H. Berning, "Physics of Thin Films", Advances in Research and Development, vol. 1 (1963), pp. 84-100.

Hawryluk et al., "Repair of Opaque Defects on Reflection Masks for Soft X-Ray Projection Lithography", J. Vac. Sci. Technol. B 10(6), Nov./Dec. 1992, pp. 3182-3185.

* cited by examiner

Fig.1(a) CLASSIFICATION OF ELECTROMAGNETIC WAVE

Fig.1(b) WAVELENGTH OF ELECTROMAGNETIC WAVE (m)

(1) OBJECT → REDUCED IMAGE
(2) REDUCED IMAGE →

MICROFOCUS ← MICROSCOPE → ENLARGED IMAGE
REDUCED IMAGE ← OBJECT

OPTICAL ELEMENT SUCH AS MULTILAYER FILM REFLECTION MIRROR, PRODUCTION METHOD THEREFOR AND DEVICE USING IT

TECHNICAL FIELD

The present invention relates to an optical element such as a reflector, and the like making use of reflection by a multilayer film, and more particularly, to the correction of a wavefront phase of rays emerging from a multilayer film reflector.

BACKGROUND ART

Figure 1A:
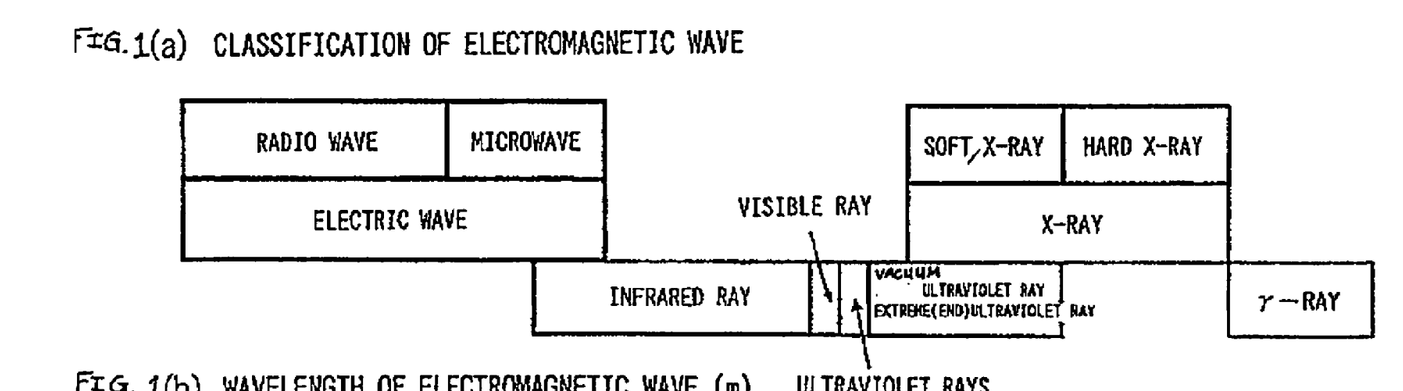
FIG. 1(a) is a view showing a classification of electromagnetic waves and wavelengths of electromagnetic waves.
Figure 1B:
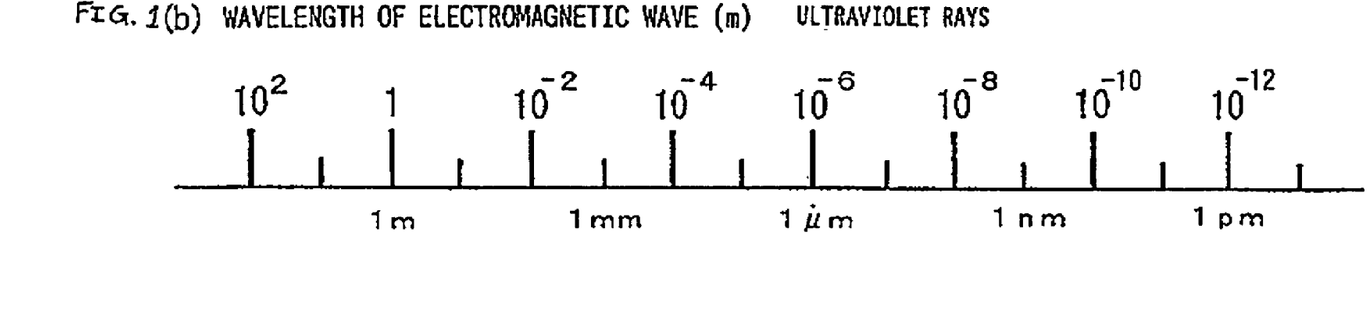
FIG. 1(b) is a view showing wavelengths of electromagnetic waves.

FIG. 1 shows a relationship between the classification of electromagnetic waves and wavelengths thereof. First, extreme ultraviolet rays and X-rays will be described with reference to FIG. 1. Extreme ultraviolet rays (EUV) and vacuum ultraviolet rays (VUV) are electromagnetic waves having a wavelength shorter than that of ultraviolet rays in the classification of the electromagnetic waves shown in FIG. 1(a). As can be seen from the comparison of the classification of the electromagnetic waves of FIG. 1(a) with the wavelengths of electromagnetic waves of FIG. 1(b), X-rays indicate electromagnetic waves having a wavelength of 0.001 to 50 nm, wherein soft X-rays indicate X-rays having a wavelength of 0.5 to 50 nm. While a boundary between extreme ultraviolet rays and vacuum ultraviolet rays and soft X-rays is not clearly determined and they are partly overlapped in the classification, extreme ultraviolet rays, vacuum ultraviolet rays, and soft X-rays are electromagnetic waves having an intermediate wavelength of the wavelengths of ultraviolet rays and hard X-rays. Extreme ultraviolet rays, vacuum ultraviolet rays, and soft X-rays have such a property that they have a small amount of transmittancy and absorbed by an air layer. However, since they have a particularly high photon energy, they exhibit a transmittance force which permits them to penetrate the interior of a material such as metal, semiconductor, insulator, and the like from the surface thereof by several hundreds of nanometers. Further, since soft X-rays have such a degree of a photon energy as to be absorbed in inner shell electrons of atoms constituting a material, they exhibit an apparent difference of absorption depending upon elements constituting various materials. This property of soft X-rays is most suitable to the study of various types of materials together with the high resolution thereof. Thus, soft X-rays contributes to the study and development of an X-ray microscope capable of observing living specimens as they are without drying and dyeing them.

Extreme ultraviolet rays (vacuum ultraviolet rays) and X-rays have a high photon energy as compared with that of visible rays and have a high transmittance force to materials. Since extreme ultraviolet rays and X-rays are not refracted in all materials because of the above reason, it is difficult to make a lens. Accordingly, while reflectors are used to converge extreme ultraviolet rays and X-rays and to form images using them, even a metal surface does not always reflect extreme ultraviolet rays and X-rays. However, since the metal surface can reflect extreme ultraviolet rays and X-rays when they are incident on it at an angle close to the metal surface, an optical system making use of oblique incidence cannot be employed.

Thereafter, a great deal of attention was paid to a "multilayer film mirror" capable of reflecting extreme ultraviolet rays (vacuum ultraviolet rays) or X-rays including soft X-rays, which opened a way for developing an optical system in which these rays were incident at near normal angle on an extreme ultraviolet ray and X-ray imaging optical system. An X-ray micrometer making use of X-rays employs the above-mentioned multilayer film mirror. The multilayer film mirror will be described with reference to FIGS. 2(a) and (b).

Figure 2A:
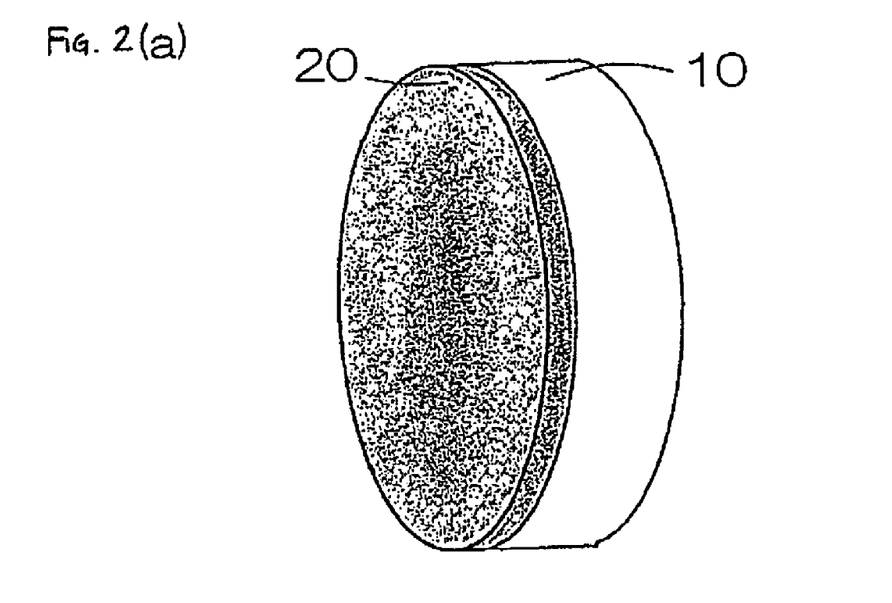
FIG. 2(a) is a view showing construction of a multilayer film mirror.
Figure 2B:
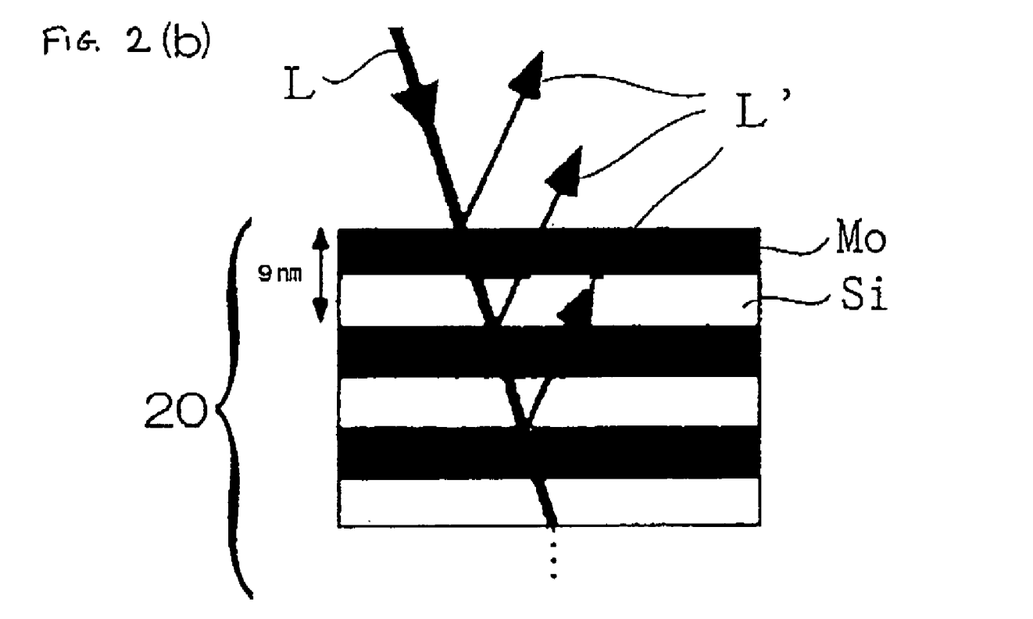
FIG. 2(b) is a view showing a Mo—Si multilayer film.

FIG. 2(a) shows construction of the multilayer film mirror, and FIG. 2(b) shows construction of a reflective film. In FIG. 2(a), the multilayer film mirror is composed of a multilayer film 20 formed on a substrate 10, and FIG. 2(b) shows an example of construction of a multilayer film used for soft X-rays having a wavelength of about 13 nm (photon energy: 97 eV). In FIG. 2(b), the multilayer film 20 is composed of several tens to several hundreds of layers, each including a pair of molybdenum (Mo) and silicon (Si). The multilayer film 20 is attached to the substrate 10 as shown in FIG. 2(a). A normal incidence reflectance of 60% can be obtained by the multilayer film mirror constructed as described above.

Figures 3A, 3B:
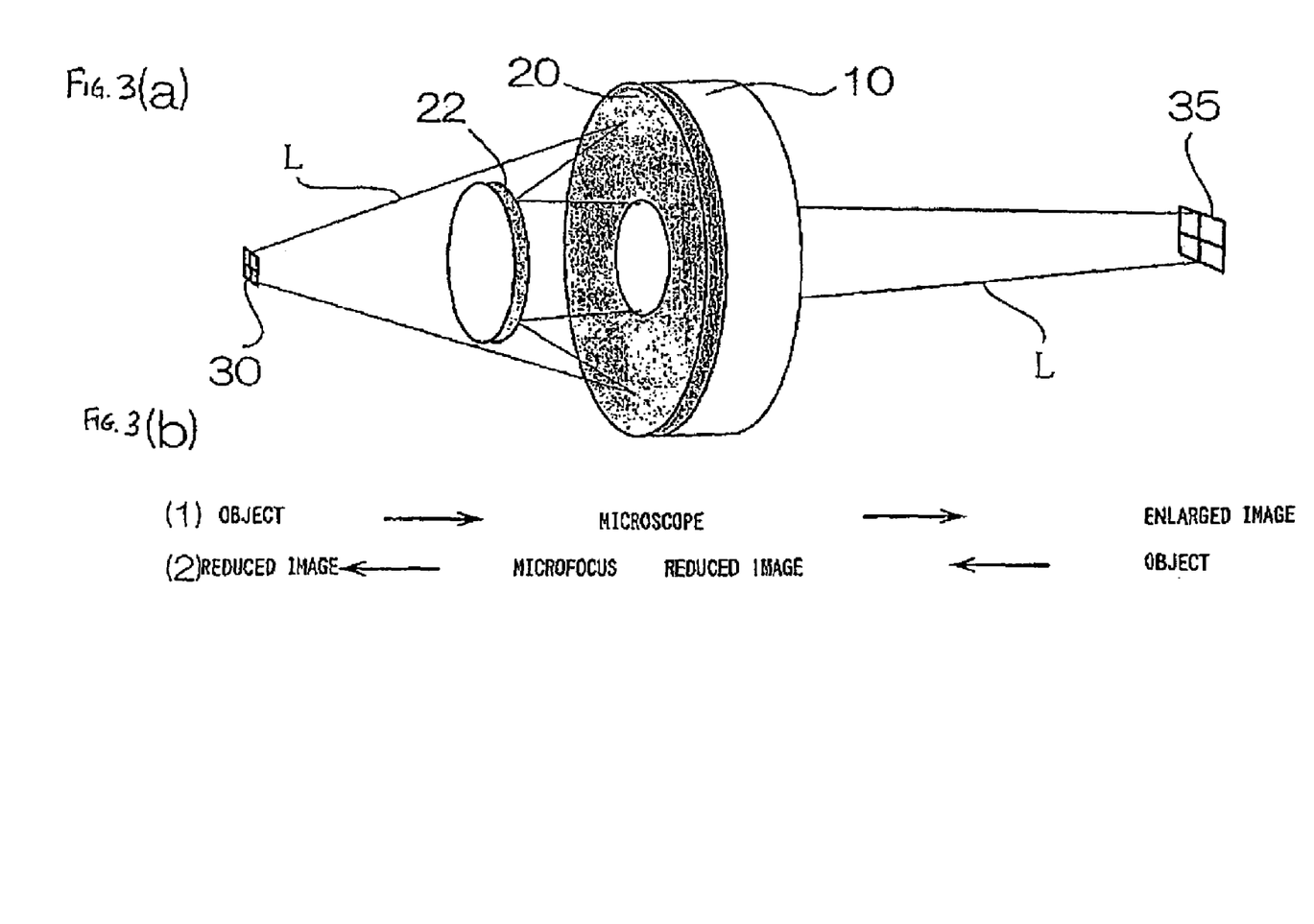
FIG. 3(a) is a view showing a schematic construction of an X-ray apparatus using a multilayer film reflector.
FIG. 3(b) is a table illustrating the corresponding functionality of the apparatus of FIG. 3(a)

FIGS. 3(a) and (b) shows an example of a schematic construction of an X-ray apparatus using the multilayer film reflector shown in FIG. 2(a). In FIGS. 3(a) and (b), the X-ray apparatus is composed of two reflectors, that is, a reflector having the reflective multilayer film 20 attached to the substrate 10 having a concave surface and a hole defined at the center thereof and a reflector having a reflective multilayer film 22 attached to a substrate having a concave surface similarly. Reference symbol L denotes X-rays and the light path thereof.

When X-rays are irradiated toward a body 30 from the left side in FIG. 3(a), the X-rays L are reflected by the multilayer film reflectors 20 and 22, and an enlarged image 35 of the body can be obtained. At that time, the apparatus shown in FIG. 3(a) achieves a role as a microscope as shown in (1) of FIG. 3(b). The image is formed by X-rays the wavelength of which is one several hundredth or less those of visual rays and ultraviolet rays, which can improve the accuracy of even a very fine body making the limit of resolution caused by unsharpness due to diffraction to one several hundredth or less in principle. The above technology is further grown to the development and study of an X-ray telescope of high accuracy, which contributes to the investigation of the origin of the Milky Way and structures of supernovas by the observation of soft X-rays generated from ultra-high temperature plasmas.

Further, when X-rays are irradiated toward the body 35 from the right side in FIG. 3(a), the X-rays L are reflected by the multilayer film reflectors 22 and 20 so that a reduced image 30 of the body comes out. At that time, the apparatus shown in FIG. 3(a) is constructed as an exposing apparatus for executing micro-focusing and reduction as shown (2) of FIG. 3(b). Competition for developing an X-ray multilayer film mirror for a reduced projection exposure optical system is carried out internationally mainly by United States and Japan to use the X-ray multilayer film mirror as a central component of a next-generation ultra LSI manufacturing apparatus.

As described above, the application of the X-ray multilayer film mirror to various fields is expected not only by industrial circles but also by academic circles.

These X-ray multilayer film mirrors must be provided with a wavefront accuracy of at least one eighth or less a wavelength to obtain an imaging performance. To achieve this value, however, it is indispensable to finally develop a method of measuring and correcting an wavefront error at a wavelength of X-rays being used, in addition to the developments of a method of measuring and controlling an accuracy of shape of a spherical substrate, a method of forming a multilayer film, which has a high reflectance and applies no distortion to a substrate, on the substrate, a method of holding an imaging mirror without distortion, a method of adjusting the imaging mirror, and the like.

In particular, the method of correcting a wavefront aberration which is definitely important to the determination of a final imaging performance is encountered with difficulty because an amount of correction is the order of nanometers. At present, an adaptive optics (compensation optical) system for minutely deforming a substrate at an accuracy of nanometers by driving a piezo element and the like, and a method of applying a thin film to the surface of a substrate or ion etching the substrate are proposed.

Figure 4:
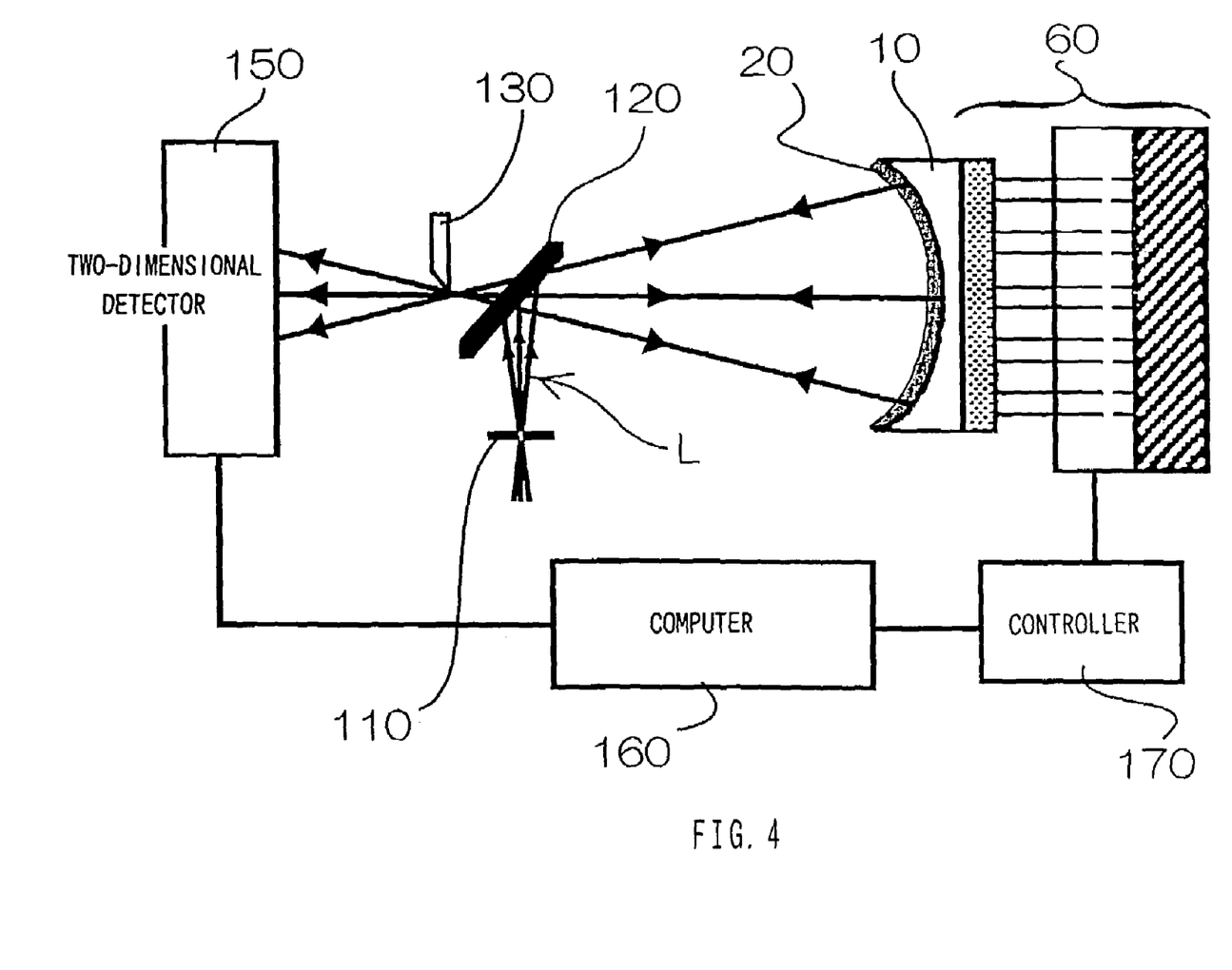
FIG. 4 is a view showing a wavefront aberration correcting apparatus for correcting a wavefront by correcting a shape of a multilayer film mirror by applying force to a substrate by an actuator.

For example, there is a trial for adaptively correcting a shape of a reflector by an actuator. This trial will be explained by a wavefront aberration correcting apparatus shown in FIG. 4. As shown in FIG. 4, the wavefront aberration correcting apparatus corrects a wavefront by correcting a shape of the multilayer film mirror 20 by applying force to the substrate 10 by an actuator 60 attached to the substrate 10 of a reflector. In the correcting apparatus, soft X-rays L passing through a pinhole 110 are introduced to the reflector by a beam splitter 120 and reflected by the multilayer film mirror 20. In the above construction, when a knife edge 130 is inserted into the light path of the soft X-rays L passing through the beam splitter 120, a shape of a mirror surface can be measured by analyzing an image projected onto a two-dimensional detector 150 with a computer 160. The shape of the reflector is corrected by operating the actuator 60 by a control circuit 170 based on a result of the measurement.

However, these methods are encountered with a great deal of difficulty because they are inevitably required to measure and control a very minute amount of 1 nm or less to geometrically and optically control a reflection surface in principle.

DISCLOSURE OF INVENTION

An object of the present invention is to provide an optical element such as a multilayer film reflector and the like having a structure capable of simply correcting a wavefront phase.

To achieve the above object, the present invention is an optical element for controlling a phase and an amplitude of emerging rays by a multilayer film, wherein a wavefront phase of the emerging rays can be adjusted by cutting away the multilayer film in accordance with an amount of adjustment of the wavefront phase. Cutting-away of the multilayer film can be controlled by detecting a difference between a plurality of materials that forms the multilayer film.

The formation of a correction film as well as the formation of a multilayer larger than necessary to substantially saturate the reflectance permits the correction of a phase by cutting away also the multilayer film when the phase cannot be corrected only by cutting away the correction film, whereby the phase can be corrected more accurately.

The use of the above-mentioned multilayer film reflector in a microscope, an exposing apparatus, a telescope, a microprobe, an analyzer and the like for X-rays and extreme ultraviolet rays (vacuum ultraviolet rays) permits a difference of phase to X-rays and extreme ultraviolet rays (vacuum ultraviolet rays) to be controlled by cutting away the multilayer film and the like, whereby a desired imaging performance can be easily obtained.

BRIEF DESCRIPTION OF THE DRAWINGS

FIGS. 8(a)–(c) is a view showing procedures for correcting the multilayer film mirror of the another embodiment, wherein FIG. 8(a) shows the correction film formed on the multilayer film that is formed on the substrate, FIG. 8(b) shows the correction film cut away by milling, and FIG. 8(c) shows the multilayer film cut away by milling;

BEST MODE OF CARRYING OUT THE INVENTION

Embodiments of the present invention will be described below in detail with reference to the drawings.

Figure 5:
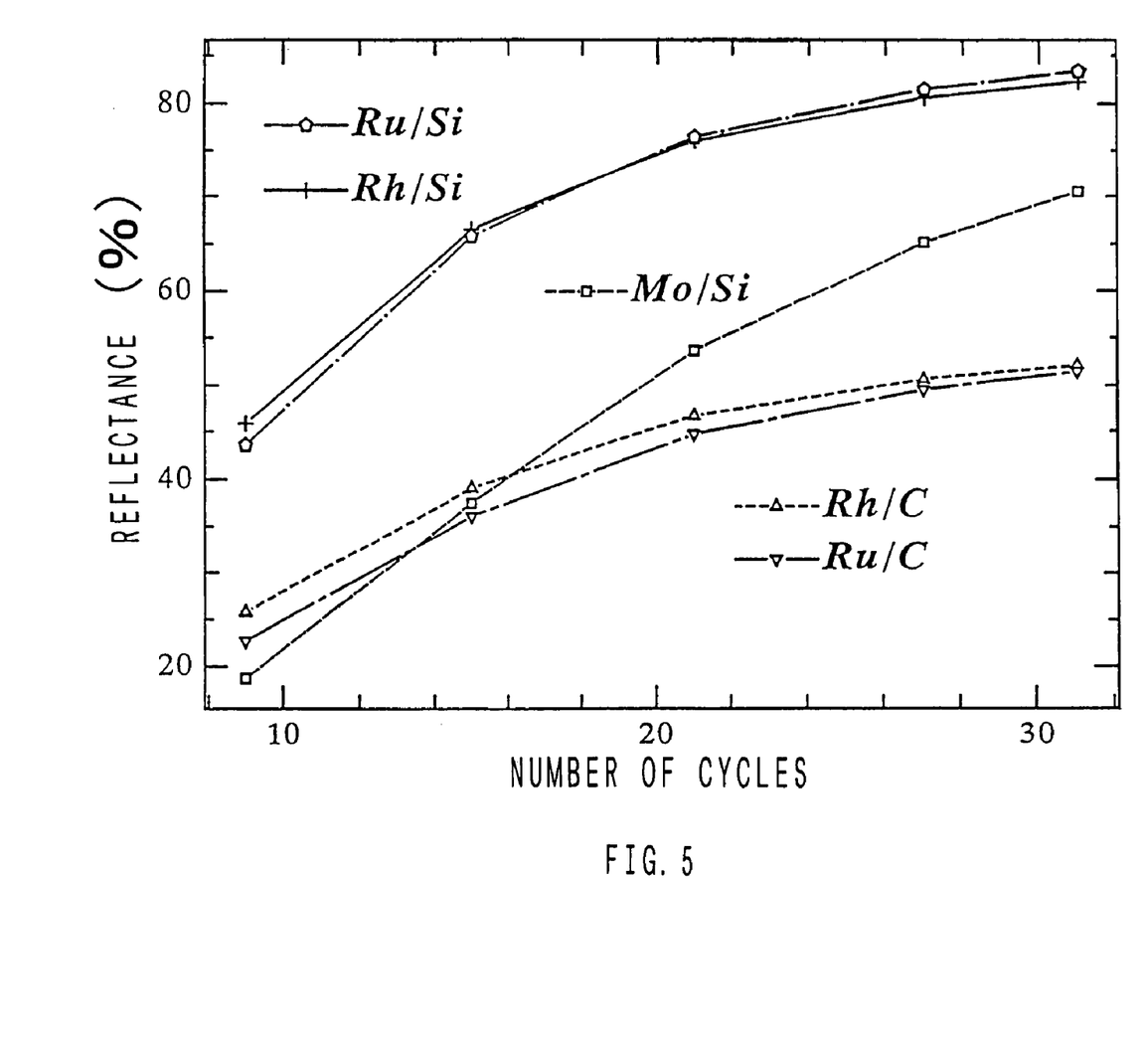
FIG. 5 is a graph showing a reflectance when a number of multilayer films for executing reflection is increased.

FIG. 5 is a graph showing a relationship between the number of cycles as the number of films of a multilayer films (number of repetitions of films constituting the reflective multilayer film, each of the films being composed of a material having a high refractive index and a material composed of a material having a low refractive index) and a reflectance in a reflector using a multilayer film as shown in FIG. 2(a). The films have an optical thickness of one fourth a wavelength, respectively. FIG. 5 shows a relationship between a multilayer film composed of ruthenium (Ru) and silicon (Si), a multilayer film composed of rhodium (Rh) and silicon (Si), a multilayer film composed of molybdenum (Mo) and silicon (Si), a multilayer film composed of ruthenium (Ru) and carbon (C), and a multilayer film composed of rhodium (Rh) and carbon (C) and reflectances.

As can be seen from the graph shown in FIG. 5, an increase in the number of cycles of the films constructing the multilayer film causes the reflectance to saturate so that the reflectance is not changed even if the films are repeated.

A saturated reflectance does not reach 100% and takes a value of about 15% to 80% in a wavelength region in which film materials that absorb extreme ultraviolet rays, soft X-rays, X-rays, and the like are used as an element of the multilayer film. In this saturated state, a multilayer film formed in the number of cycles larger than that necessary to saturation changes the phase of reflected rays while it does not contribute to an increase in an amplitude.

Therefore, a wavefront phase can be corrected by forming a multilayer film the number of cycles of which is larger than that necessary to substantially saturate a reflectance and by cutting away the multilayer film in the range in which the reflectance is saturated because of a reason described below. That is, several tens to several hundreds of layers of lamination is necessary in a multilayer film mirror used for, for example, X-rays, and extreme ultraviolet rays (vacuum ultraviolet rays) because a very minute amount of reflection is caused on respective boundaries. According to a theoretical analysis, reflection is caused on an overall multilayer film physically and optically. Therefore, the surface portion of the multilayer film acts as a transmission film.

The present invention corrects the wavefront phase of emerging rays by forming a multilayer film having the number of cycles which is larger than that by which a reflectance is substantially saturated and by cutting away the multilayer film in accordance with an amount of adjustment of the wavefront phase. When the amount of correction is relatively small, the phase can be corrected by cutting away the multilayer film so that the variation of a reflectance can be reduced as compared with a case in which the multilayer film is formed by adding a correction film as described below.

Figure 6:
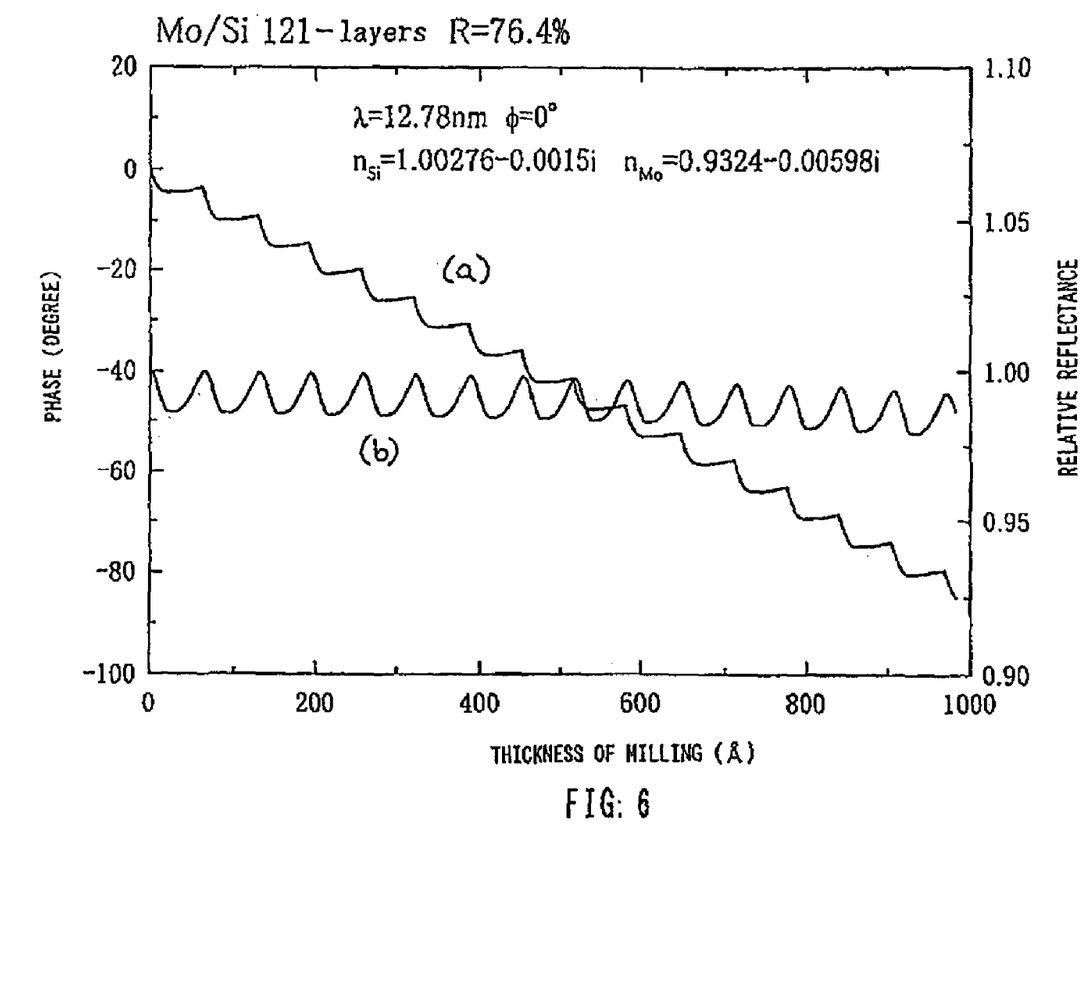
FIG. 6 is a graph showing a change of a phase and a reflectance when the multilayer films which larger than that necessary to saturate the reflectance are removed.

FIG. 6 shows an example in which changes of a phase and a reflectance are measured by cutting away a multilayer film formed in the number of cycles larger than necessary to saturate the reflectance. Soft X-rays measured have a wavelength of 12.78 nm, and the multilayer film is composed of Mo/Si, has a thickness one fourth a wavelength and is formed of 121 layers. Complex refractive indices $n_{si}$ and $n_{Mo}$ of silicon (Si) and molybdenum (Mo) that form the multilayer to the soft X-rays having the wavelength of 12.78 nm are as follows.

$n_{Si}=1.00276-0.0015i$ $n_{Mo}=0.9324-0.00598i$

A reflectance by the multilayer film is 76.4%. FIG. 6 shows a change of a phase (a) and a change of a relative reflectance (b), respectively when the multilayer film is cut away from the upper portion thereof. As can be seen from the graph, even if the multilayer film, which is formed in the number of cycles larger than that necessary to saturate a reflectance, is cut away, the reflectance is not changed, but the phase of reflected rays is changed.

A step at which the phase is changed in FIG. 6 is caused by milling (cutting away) one cycle of the multilayer film. That is, the phase is changed in such a manner that it is reduced by milling a Mo film and slightly increased by milling a Si film. Since each layer of the Mo/Si multilayer film shown in FIG. 6 has a film thickness of about 4 nm, milling of one Mo layer corresponds to the reduction of a phase angle of 5°. When this value is shown as an error of shape of a substrate, it corresponds to (13 nm/2)*(5°/360°)=0.09 nm, which shows that the error of shape of the substrate can be digitally controlled by 0.9 Å by milling one cycle of the film. In other words, when it is intended to mill a predetermined portion of a surface in a certain amount of correction, a milling thickness can be precisely controlled by stopping milling when a material appearing on the surface is changed from Mo to Si.

A change of a material caused by milling can be simply monitored using a method of monitoring a material discharged by milling, an electronic method of utilizing a change of a material in a secondary electron discharge yield, a reflectance measuring method utilizing an optical change of characteristics such as a change of an optical constant of visible rays, ellipsometry, and the like. These methods can be easily used together with a most ordinary method of controlling a milling depth by a cutting-away time by stabilizing an amount to be cut-away in time. These features result from that the phase is corrected by milling at least one cycle of the surface of the multilayer film.

It has been described above that when milling is carried out for each one cycle in the example of the Mo/Si multilayer film shown in FIG. 6, an accuracy of 0.1 nm can be achieved to the error of shape of the substrate. However, when the milling of one cycle is examined in detail, the following steps can be found:

1. the phase is not almost changed in the milling of the Si layer (actually, the phase is slightly increased because a refractive index is slightly larger than 1);

2. at the same time, a relative intensity reflectance is in a flat state in which it is not almost changed while the Si layer is being milled (the bottom portion of a change of oscillation due to interference); and 3. in contrast, the phase is reduced and the reflectance is changed while the Mo layer is being milled.

Accordingly, when milling is stopped at the portion of each Si film in the above digital milling, only the phase is changed by a predetermined angle (about 6°) each time, and the reflectance is not changed. Specifically, since it is sufficient to stop milling when Si appears by milling a Mo layer, a timing at which milling is stopped has a large amount of allowance. Specifically, when a Si film has a thickness within the range of about 3.5 nm, it has an allowance of at least +1 nm. Further, a change of the reflectance can be easily made within 1% making use of this property.

Incidentally, when a complex amplitude reflectance of a multilayer film is taken into consideration on a complex plane, a radius vector is equal to an amplitude and an angle of deviation is represented by the same point. Therefore, cutting-away of the multilayer film causes the complex amplitude reflectance to move on a circumference the center of which substantially coincides with an origin.

Theoretically, when a change of an amplitude reflectance is determined in the cutting-away of a multilayer film from the upper surface thereof, a reference of calculation of a phase and an amplitude resides on the uppermost surface of the multilayer film at all times. Thus, it is necessary to use the surface of the multilayer film before it is cut away as the reference surface of the phase to calculate an effect for cutting a certain portion from the surface. To satisfy this object, it is necessary, when a certain thickness d is cut away, to calculate the effect by assuming that a vacuum layer is laminated by the thickness d. This assumption makes it possible to fix the reference surface fixed at a position prior to cutting-away at all times so that the effect of a predetermined phase and a predetermined amplitude obtained by the cutting-away can be precisely calculated.

Figure 7:
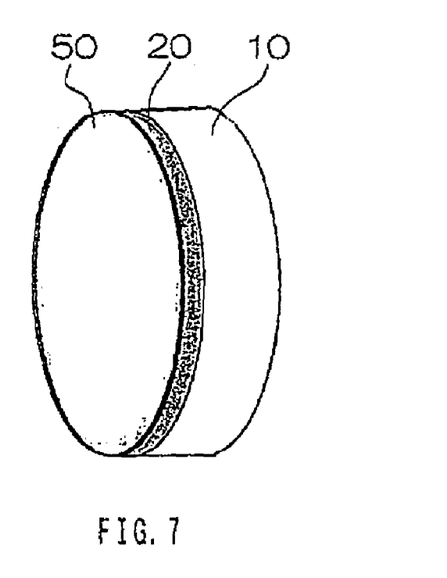
FIG. 7 is a view showing construction of a multi-layered mirror of another embodiment of the present invention.

FIG. 7 shows another construction of a reflector of the present invention. In FIG. 7, a correction film 50 is formed on a multilayer film 20 which is formed on a substrate 10 in the number of cycles larger than that necessary to saturation.

In a multilayer film mirror used for, for example, X-rays and extreme ultraviolet rays (vacuum ultraviolet rays), several tens to several hundreds of layers of lamination are necessary because a reflection is caused very slightly on respective boundaries. According to a theoretical analysis, reflection is caused on an overall multilayer film physically and optically. Thus, as shown in FIG. 7, the addition of the phase correction film 50 on the uppermost surface of the multilayer film 20 larger than substantial saturation permits the film 50 to act as a transmission phase correction film. However, since no transparent material exists in this wavelength region, a material which can constitute the phase correction film must satisfy the condition of an extinction coefficient k together with a refractive index n.

A film material constituting the correction film can provide a larger amount of phase correction when it has a larger difference between refractive indexes (1−n) and a smaller extinction coefficient k. Therefore, an optical reference for selecting a material can be judged by a ratio between an amount of change of a phase caused by a unit thickness and damping of an amplitude caused by absorption, and a suitable material has a lager value of {difference between refractive indexes (1−n)/extinction coefficient k}.

When soft X-rays having a wavelength of 13 nm is used as an example, the use of molybdenum (Mo) film, in which a difference (1−n) between a refractive index n of the film and a refractive index 1 of vacuum in a soft X-rays region is about 0.1 or less (difference between refractive indexes: 0.065, extinction coefficient: 0.0065) permits a film thickness to be geometrically controlled at a resolution of about ⅕ because a difference of a phase is physically optically controlled in a difference between refractive indexes (1−n) of about ⅕. That is, an effective wavefront control of 1 nm of an X-ray multilayer film imaging mirror can be achieved by the control of the molybdenum film having a film thickness of 15 nm, and a desired imaging performance can be obtained. Thus, it is sufficient to cut away the correction film at an accuracy of 1.5 nm of a film thickness to correct a phase error at an accuracy of 0.1 nm because the amount of correction is a product of the difference between refractive indexes (1−n) and the amount of change Δd of the film thickness d.

Further, a change of reflectance caused by a correction film must be calculated in consideration of a change of film thickness and interference of a multilayer film. However, a reduction rate of reflectance is about 1.2%/nm even if it is simply calculated and it is reduced only by about 0.7% in a mirror having a reflectance of 60%.

When sufficient correction cannot be performed by the correction film, correction can be further carried out by cutting away the multilayer film larger than that necessary to substantial saturation.

Ruthenium, rhodium, and beryllium are available as the material having a large difference between refractive indexes (1−n) and a small extinction coefficient k. A correction film to soft X-rays can be composed of one of these materials including molybdenum or a combination of these materials.

Figure 8A:
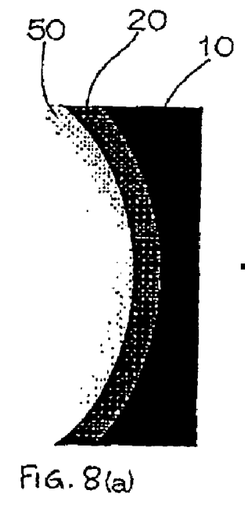
Figure 8B:
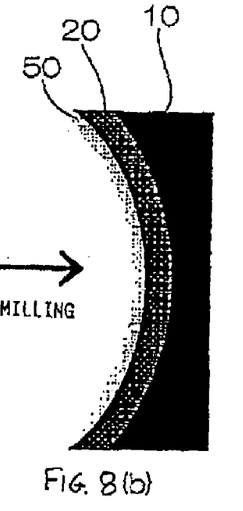
Figure 8C:
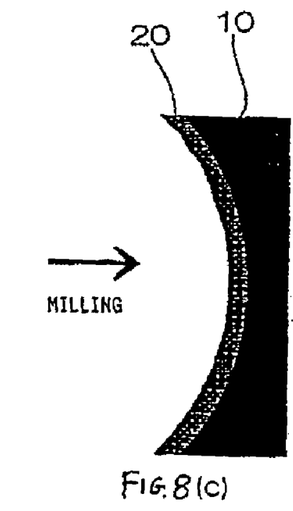

FIGS. 8(a)–(c) explains a method of correction using the correction film and the multilayer film shown in FIG. 7.

As shown in FIG. 8(a), the correction film 50 having a sufficient thickness is previously formed on the multilayer film 20 that is formed on the substrate 10, and the correction film 50 is cut away by milling in a necessary amount (refer to FIG. 8(b)). When the correction film 50 cannot be sufficiently cut away, the multilayer film is cut away (refer to FIG. 8(c)).

While the uppermost surface of the correction film and the like having been milled by the method is roughened, a transmission wavefront is hardly affected by the roughness because the difference of the refractive index thereof to vacuum is small.

Figure 9A:
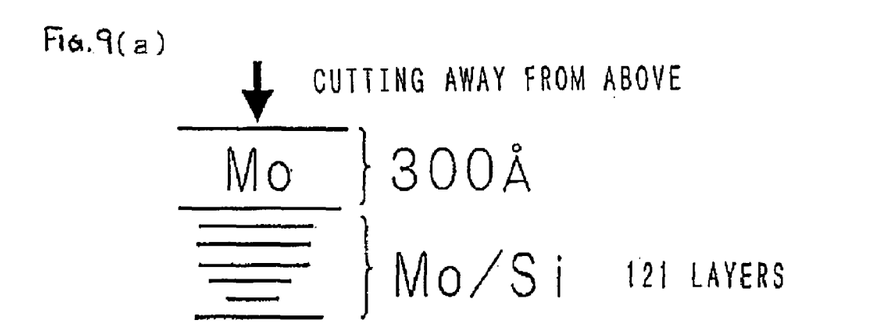
FIG. 9(a) is a symbolic representation of the Mo correction film being cut away.

FIGS. 9(a) and (b) comprise a graph showing an example that after a multilayer film was formed in the number of cycles which was larger than that necessary to substantial saturation and a correction film was formed thereon, the correction film and the multilayer film were cut away from the upper portions thereof as explained in FIGS. 7 and 8(a)–(c), and a change of wavefront phase was measured. As shown in FIG. 9(a), after 121 cycles of a Mo/Si multilayer film was formed and a molybdenum (Mo) correction film of 300 Å was formed thereon, the Mo correction film was cut away from the upper portion thereof. A complex refractive index of silicon (Si) $n_{Si}$ and a complex refractive index of molybdenum (Mo) $n_{Mo}$ that formed the multilayer film to soft X-rays having a wavelength of 12.78 nm were as follows.

$n_{Si} = 1.00276 - 0.0015i$ $n_{Mo} = 0.9324 - 0.00598i$

Further, a reflectance of the 300 Å correction film and the 121-multilayer film was 56.2%.

Figure 9B:
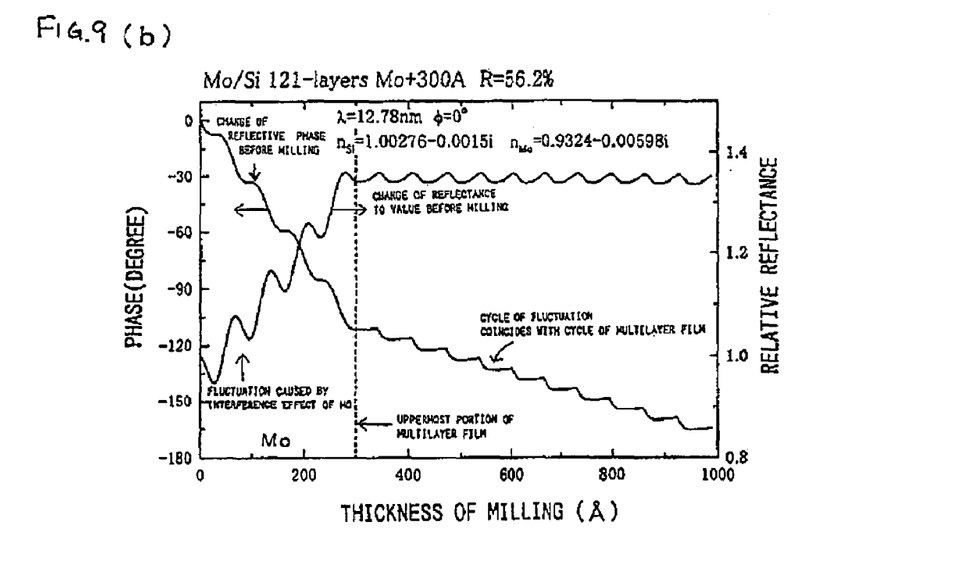
FIG. 9(b) is a graph showing a case in which an auxiliary film and the multilayer film which has the number of cycles larger than that necessary to saturate a reflectance are cut away.

FIG. 9(b) shows a case in which the correction film and the multilayer film constructed as described above were cut away from the upper portions thereof. FIG. 9(b) shows a relative reflectance to the soft X-rays having the wavelength of 12.78 nm (which is 1 when they are not cut away: shown on a right scale) and a change of wavefront phase (which is 0 when they are not cut away: shown on a left scale). When the correction film is cut away, the phase and the reflectance are not changed linearly and are variably changed by the interference of the Mo film. Further, when the multilayer film is cut away, the cycles of change of the phase and the reflectance coincide with the cycles of the cyclic film. A change of reflectance, when the multilayer film portion is cut away, is small as compared with a change thereof when the correction film is cut away.

As can be seen from the graph of FIG. 9(b) showing the correction film having been cut away, the phase can be changed by cutting away also the multilayer film. However, an amount of correction of phase to a cut-away amount, which can be achieved by cutting away the multilayer film, is smaller that achieved by cutting away the correction film.

<Example of Use of Reflector>

Figure 10:
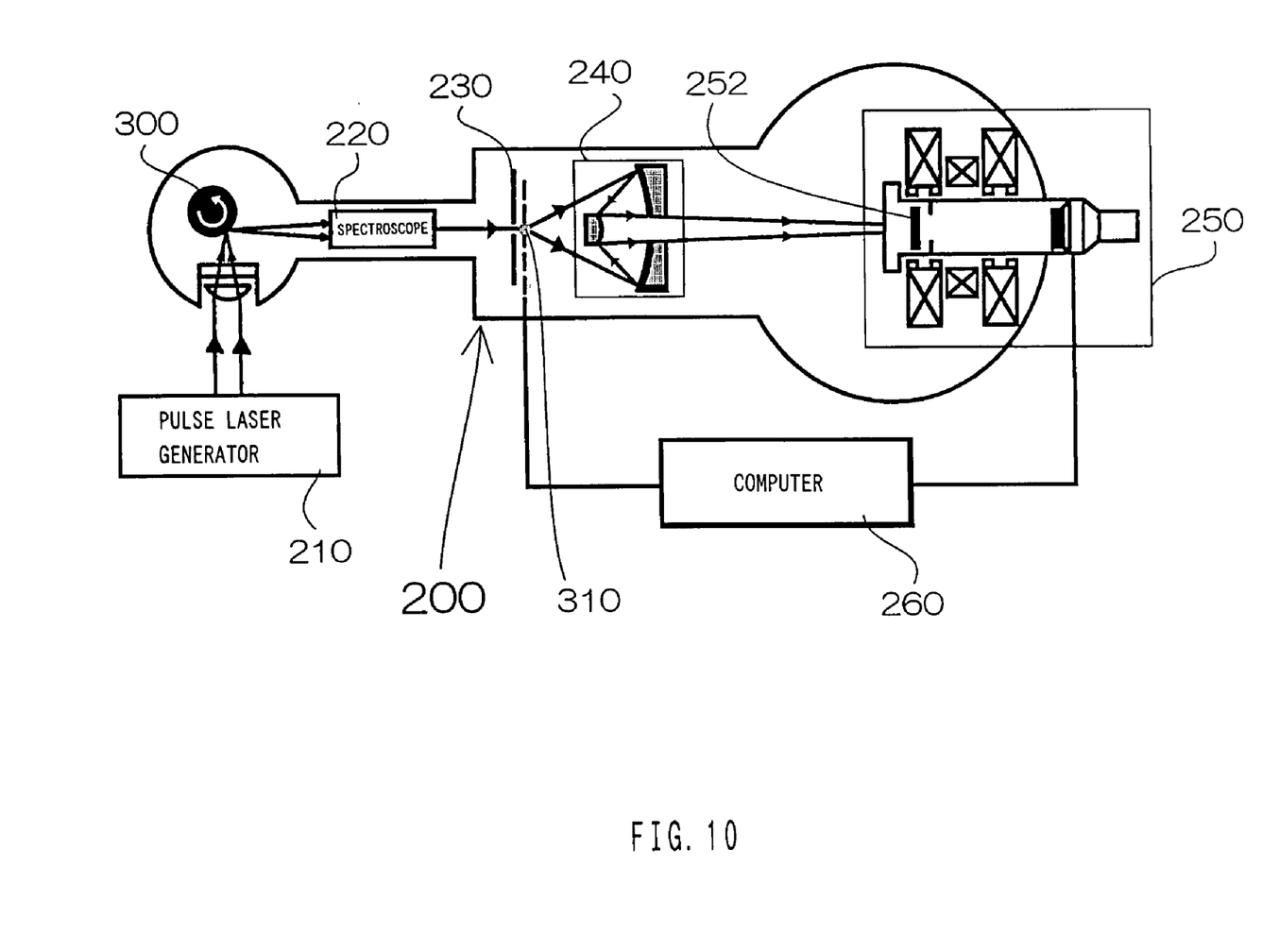
FIG. 10 is a view showing construction of a soft X-ray microscope system using the multilayer film of the present invention.

FIG. 10 shows a soft X-ray microscope system using the above-mentioned reflector capable of simply correcting a wavefront error. A light path of soft X-rays is disposed in a vacuum vessel 200 because soft X-rays are absorbed by air. Further, the system is roughly divided into four components of a light source, an imaging optical mirror, a detection subsystem, and a control/measurement subsystem, and can observe a specimen 310 using these components.

A laser generator 210, a metal target 300, a spectroscope 220, and a pin hole 230 are used as the soft X-ray source. The imaging optical mirror 240 is composed of a combination of the above-mentioned multilayer film mirror, which has a concave surface and a hole defined at the center thereof, and the above-mentioned multilayer film mirror having a convex surface and disposed just in front of the above multilayer film mirror. The microscope system further includes a two-dimension detector 250 and a computer 260. The two-dimension detector 250 has a photoelectric surface 252 for detecting the soft X-rays irradiated to the specimen 310, and the computer 260 captures detected data and controls a position of the specimen.

In this construction, first, when strong infrared pulse laser is converged at the metal target 300 by the pulse laser generator 210 through a lens to generate soft X-rays as a light source, plasma having a high energy is generated. The plasma emits electromagnetic waves having various wavelengths. Thus, soft X-rays are taken out from the electromagnetic waves having the various wavelengths using the spectroscope 220. The soft X-rays emerging from the spectroscope 220 pass through the pin hole 230 and irradiates the specimen 310.

The soft X-rays irradiated to the specimen 310 enlarge the image of the specimen 310 by the imaging optical mirror 240 and form it on the photo electric surface 252 of the two-dimension detector 250. Then, the computer 260 captures the data detected by the two-dimension detector 250 and forms it as an image. The computer 260 also controls a position of the above-mentioned specimen 310, in addition to the above.

The use of the above-mentioned construction in the reflector used in the microscope system as described above can correct a wavefront aberration of rays at an accuracy and a resolution of 1 nm or less. With this construction, an optimum wavefront accuracy can be obtained in accordance with a state in which the reflector is used by finally correcting an X-ray wavefront using a correction film and the like after a multilayer film is formed even if an error of shape of a substrate does not reach a desired value.

Figure 11:
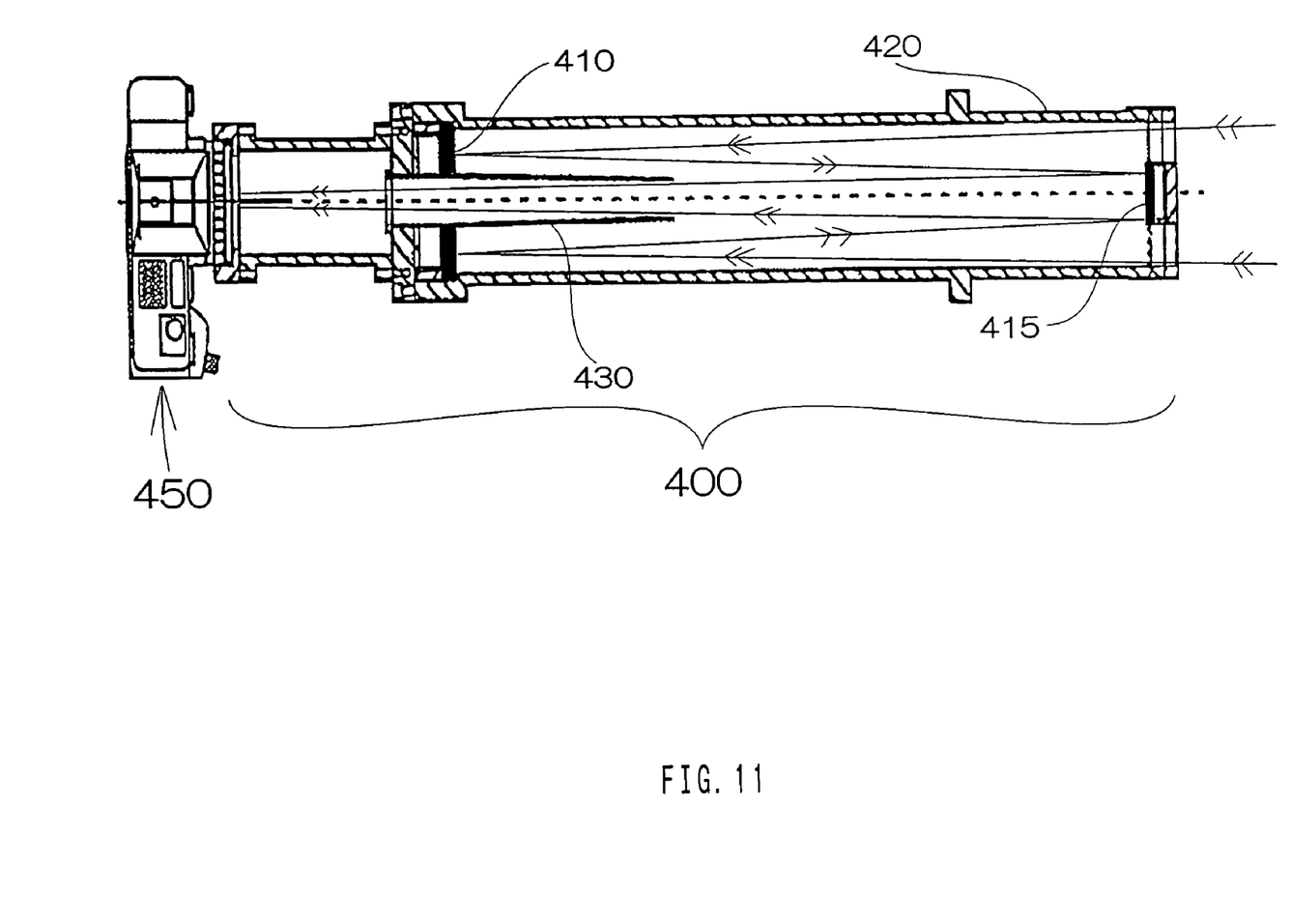
FIG. 11 is a view showing construction of a soft X-ray telescope system using the multilayer film of the present invention.

In the application of the reflector to an X-ray telescope, a telescope of a directly incident Cassegrainian telescope and the like of light weight and high performance can be constructed in place of a nested-type telescope having an obliquely incident cylindrical mirror as a nest by employing correction executed by the correction film and the like. FIG. 11 shows an example of construction of the telescope.

In FIG. 11, a reflective type telescope 400 is mounted on a camera 450. The multilayer film reflector described above is used in each of reflectors 410 and 415 constructing the reflective type telescope 400. After rays incident on an outside cylinder 420 are reflected by the reflector 410, they are reflected by the reflector 415 and incident on the camera 450 from a baffle 430.

With this construction, an ultimate resolution as small as an aproximate observing wavelength, which cannot be obtained by a conventional telescope, can be expected in an X-ray telescope of light weight and high performance, which is mounted on, for example, an artificial satellite, by reducing a wavefront aberration of a multilayer film mirror.

The above-mentioned multilayer film reflector can also be used in an X-ray microprobe. In the application of the multilayer film reflector to the X-ray microprobe, a special resolution, which is conventionally several tens of micrometers, can be reduced up to the region of 0.01 μm, which can dramatically widen subjects to be inspected by the X-ray microprobe including various types of submicron devices.

The above-mentioned multilayer film reflector can be used also in an X-ray analyzer. The X-ray analyzer can improve an angle accuracy as well as can observe a minute specimen because it can collimate beams parallel or converge them. Further, the multilayer film reflector can be applied to the analysis of a two-dimensional image by being combined with an imaging system.

Defects made on a reflective wavefront can be repaired in a multilayer film reticle mask and an imaging mirror used in a reduced projection exposure optical system, in addition to the above-mentioned X-ray microscope, X-ray telescope, X-ray microproble, and X-ray analyzer.

Since the wavefront of the multilayer film mirror can be easily corrected in the various applications of the X-ray transmission multilayer film in addition to the above, the phase of X-ray transmission and reflection wavefronts can be adjusted to target values and target two-dimensional distributions.

While the application of the multilayer film reflector to the equipment using X-rays is described above, it is needless to say that the multilayer film reflector can also be used in equipment using extreme ultraviolet rays (vacuum ultraviolet rays), and the like in the same way. Further, since the principle of the present invention utilizes the physical and optical properties of rays, the present invention is effective to all the electromagnetic waves making use of a multilayer film such as ultraviolet rays, visible rays, infrared rays, and further a microwave region, and the like. For example, in the application for increasing an accuracy of a reflective wavefront, the present invention is very effective to a mirror for a laser oscillator and to a mirror constructing similar Fabry-Perot and ring laser gyro resonators. Further, since it is possible to provide special wavelength dispersion characteristics making use of a diffractive effect, a polarizing element having wavelength dispersion can be made by the utilization of polarizing characteristics accompanying with the special wavelength dispersion characteristics. Thus, the polarizing element can be used in a mirror and a beam splitter. In particular, the polarizing characteristics are effective to a half mirror of a photomagnetic apparatus.

It is also possible to make a phase grating using the multilayer film of the present invention. In the formation of the phase grating, a groove structure having a thickness for providing a phase difference of 180° is formed on the surface of a substrate using the multilayer film. The phase grating is a diffraction grating of a new type that acts as a two-dimensional phase grating. In a conventional method, since the surface of a substrate is roughed due to a groove structure formed on the substrate, the characteristics of a multilayer film formed on the surface is deteriorated. Further, a processing accuracy must be kept to at least one-twentieth or less a wavelength to be used.

The method of the present invention can achieve an accuracy, which cannot be achieved by a conventional geometrical reflective surface position control, by controlling a difference of light path. The difference of light path is a product of a milling thickness d of a multilayer film and a difference between refractive indexes (n−1). The difference of reflective indexes is a difference between an average refractive index n of a multilayer film and a refractive index 1 of vacuum (medium). A smaller value of (n−1) increases an accuracy of a wavefront which is corrected by milling a thickness d. When visible rays are used in a transparent material such as a glass, improvement in accuracy is doubled (1.5−1=0.5), whereas, in a soft X-ray region, improvement of accuracy of the order of one hundred times is expected because a refractive index is slightly smaller than 1 and (1−n) is the order of 0.01.

Further, the multilayer film of the present invention can be used as an amplitude modulation hologram. In this case, the hologram is formed by cutting away the multilayer film by two dimensionally controlling a surface shape in a plane so as to regulate the phase and the amplitude of a wavefront from which rays emerge.

An element which can be used to filter a phase and an amplitude can be formed by forming the multilayer film of the present invention. In this case, a novel means for executing various types of filtering in a spatial frequency space is provided by combining the multilayer film with an imaging system.

The present invention can provide a new method of realizing a novel image display panel and the like by further modulating an optical length (length of a light path) in time in the above method. Further, the multilayer film can be used as a transmission type multilayer film because it substantially acts as a transmission film with respect to reflection from a lower portion.

In addition to the above-mentioned, when such a characteristic that a refractive index is greatly different depending a wavelength is utilized, an element can be made which makes use of a phenomenon that a different surface shape appears depending upon a length of rays. For example, an mirror used for extreme ultraviolet rays (EUV) has an ideal shape (for example, spherical shape) to EUV rays. However, since the spherical surface shape disappears after a wavefront is corrected, the mirror has such characteristics that rays reflected on the surface of the mirror are, for example, diverged apart from the spherical surface. That is, a different refractive index can provide characteristics which are similar to a case in which a surface shape is changed depending upon a wavelength. This permits a mirror to be made which has such a feature, for example, that while rays having a certain wavelength is converged by the mirror, rays having other wavelength are not converged thereby. When this feature is applied to an imaging system, an optical system, in which an image can be formed sharply by rays having a certain wavelength but an image formed by rays of other wavelength is made unsharp. On the contrary, when the rays are stopped at a converging point, an image is formed by rays from which a certain wavelength is removed. This means that a reflector having a very large amount of color aberration can be made in, for example, a transmission optical system. When this feature is developed, an element, which positively makes use of dispersion of a wavelength of a refractive index, such as a mirror having a different focal length depending upon a wavelength, a double focus mirror, and the like can be realized. A refractive index is only slightly dispersed in a conventional transmission optical element because the element makes use of a transparent material, that is, a material in which a refractive index is normally dispersed. Thus, the element is utilized only in a prism type spectrometer, and the like, in which dispersion of refractive index is an obstacle that is rather useless as color aberration. The multilayer film reflector of the present invention is basically constructed as a reflective type reflector, which makes various combinations possible from X-rays to infrared rays and microwaves regardless of the wavelengths thereof. A refractive index is greatly changed in an abnormal dispersion region of various materials or in a region thereof where absorption is caused by molecules, and these materials can be positively utilized.

INDUSTRIAL APPLICABILITY

As described above, the present invention can remarkably improve the property of a multilayer film formed for the purpose of controlling the phase and the amplitude of rays and rays emerging from electromagnetic waves. In particular, in an imaging optical system making use of the multilayer film, an imaging performance can be improved up to a limit by improving the controllability of a wavefront phase of reflection and transmission.

The invention claimed is:

1. A method comprising:
   forming, on a substrate having an error of shape, a multilayer film stack of alternating layers of high refractive index material and low refractive index material and that reflects radiation in a range from vacuum ultraviolet through X-ray; and
   cutting away at least one cycle of alternating layers from a portion of the multilayer film stack so that the multilayer film stack, having said at least one cycle cut away, corrects a wavefront aberration of a wavefront phase of a light reflected by the multilayer film stack that would have been caused by the error of share of the substrate if said at least one cycle of alternating layers were not cut away.

2. The method according to claim 1, wherein the multilayer film stack is formed in a number of cycles of alternating layers of high refractive index material and low refractive index material larger than that necessary to saturate a reflectance.

3. The method according to claim 1, wherein said cutting away is controlled by detecting a difference in a material that forms the multilayer film stack.

4. The method according to claim 3, wherein a difference in material is detected by monitoring a secondary electron discharge.

5. The method according to claim 3, wherein a difference in material is detected by monitoring an optical change of characteristics.

6. The method according to claim 5, wherein said optical change of characteristics monitored is a change in an optical constant of visible rays or a change based on ellipsometry.

7. A method for forming an optical element that reflects radiation in a range from vacuum ultraviolet through X-ray, comprising:
   forming on a substrate a multilayer film having a stack of alternating layers of high refractive index material and low refractive index material in a number of cycles larger than necessary to saturate reflectance;
   forming a correction film on the multilayer film; and
   cutting away a portion of the correction film and the multilayer film stack in accordance with an amount of adjustment of a wavefront phase of emerging rays.

8. A multilayer film reflection mirror that reflects radiation in a range from vacuum ultraviolet through X-ray comprising:
   a substrate having an error of shape; and
   a multilayer film formed on the substrate for reflecting the radiation, wherein the multilayer film is formed by a plurality of repeated pairs of layers, layers of each pair of layers having different refractive indexes from each other, at least one pair of layers successively arranged from an outermost surface of the multilayer film having a predetermined portion in which material of the respective layers of the respective pair does not exist so that the respective layers are thereby non-uniform across the multilayer film, and so that the multilayer film thereby corrects a wavefront aberration of a wavefront phase of a light reflected by the multilayer film that would have been caused by the error of shape of the substrate if said at least one pair of layers successively arranged from the outermost surface of the multilayer film did not have said predetermined portion.

9. The multilayer film reflection mirror according to claim 8, wherein said wavefront aberration is corrected with more than one layer among said plurality of repeated pairs.

10. The multilayer film reflection mirror according to claim 8, wherein the multilayer film is formed by repeated pairs of layers whose number exceeds a number at which reflectivity is substantially saturated.

11. The multilayer film reflection mirror according to claim 10, wherein the wavefront aberration is corrected with more than one layer among the pairs of layers where the reflectivity is already saturated being partially removed.

12. The multilayer film reflection mirror according to claim 10, wherein reflectivity of said multilayer film is between about 15% and about 80%.

13. The multilayer film reflection mirror according to claim 8, wherein said light is an EUV light.

14. The multilayer film reflection mirror according to claim 8, wherein said multilayer film is formed by pairs of molybdenum and silicon layers.

15. The multilayer film reflection mirror according to claim 8, wherein said multilayer film is multilayer film formed by pairs of ruthenium and silicon layers, a multilayer film formed by pairs of rhodium and silicon layers, a multilayer film formed by pairs of ruthenium and carbon layers, or a multilayer film formed by pairs of rhodium and carbon layers.

16. An exposure apparatus comprising: a mirror comprising:
   a substrate having an error of shape; and
   a multilayer film formed on the substrate and reflecting radiation in a range from vacuum ultraviolet through X-ray, the multilayer film formed by a plurality of repeated pairs of layers, layers of each pair of layers having different refractive indexes from each other, at least one repeated pair of layers successively arranged from an outermost surface of the multilayer film having a predetermined portion in which material of the respective layers does not exist so that the respective layers are thereby non-uniform across the multilayer film and so that the multilayer film thereby corrects a wavefront aberration of a wavefront phase of a light reflected by the multilayer film that would have been caused by the error of shape of the substrate if said at least one repeated pair of layers successively arranged from the outermost surface of the multilayer film did not have said predetermined portion.

17. A method of manufacturing a multilayer film reflection mirror, comprising;
   forming a substrate having an error of shape; and
   forming a multilayer film on the substrate, the multilayer film having a plurality of repeated pairs of layers and reflecting radiation in a range from vacuum ultraviolet through X-ray, each pair of layers having layers with different refractive indexes from each other, at least one pair of layers successively arranged from an outermost surface of the multilayer film having a predetermined portion in which material of the respective layers does not exist so that the respective layers are thereby non-uniform across the multilayer film, so that the multilayer film thereby corrects a wavefront aberration of a wavefront phase of a light reflected by the multilayer film that would have been caused by the error of shape of the substrate if said at least one pair of layers successively arranged from the outermost surface of the multilayer film did not have said predetermined portion.

18. The method according to claim 17, further comprising partially removing at least one layer among said plurality of repeated pairs of layers, to thereby provide said at least one pair of layers successively arranged from an outermost surface of the multilayer film having a predetermined portion in which material of the respective layers does not exist.

19. The method according to claim 18, wherein the removing of the multilayer film is stopped at a portion of a layer having a relatively higher refractive index among said layers in a pair having different refractive indexes from each other.

20. The method according to claim 19, wherein said layer having a relatively higher refractive index is made of silicon.

21. The method according to claim 17, wherein said multilayer film is formed by repeated pairs whose number exceeds a number at which reflectivity substantially is saturated.

22. The method according to claim 21, further comprising partially removing more than one layer among the pairs of layers of the multilayer film where the reflectivity is already saturated, to thereby provide said at least one pair of layers successively arranged from an outermost surface of the multilayer film having a predetermined portion in which material of the respective layers does not exist.

23. The method according to claim 21, wherein reflectivity of said multilayer film is between about 15% and about 80%.

24. The method according to claim 17, wherein said light is an EUV light.

25. The method according to claim 17, wherein said multilayer film is made from molybdenum and silicon layers.

26. The method according to claim 17, wherein said multilayer film is multilayer film formed with pairs of ruthenium and silicon layers, a multilayer film formed with pairs of rhodium and silicon layers, a multilayer film formed with pairs of ruthenium and carbon layers, or a multilayer film formed with pairs of rhodium and carbon layers.

27. An optical element comprising:
   a substrate having an error of shape;
   a multilayer film formed on the substrate, the multilayer film having a stack of alternating layers of high refractive index material and low refractive index material in a number of cycles larger than necessary to saturate reflectance; and
   a correction film on the multilayer film,
   wherein the multilayer film reflects radiation in a range from vacuum ultraviolet through X-ray, and the correction film and the stack each have a cut away portion with at least one cycle of alternating layers being cut away in the cut away portion of the stack, so that the stack having said cut away portion corrects a wavefront aberration a wavefront phase of a light reflected by the multilayer film that would have been caused by the error of shape of the substrate if the stack did not have said cut away portion.

28. A multilayer film reflection mirror comprising:
   a substrate having an error of shape; and
   a multilayer film formed on the substrate and reflecting radiation in a range from vacuum ultraviolet through X-ray, wherein at least one cycle of a predetermined portion of the multilayer film corrects a wavefront aberration of a wavefront phase of a light reflected by the multilayer film that would have been caused by the error of shape of the substrate if said at least one cycle did not make a correction.

* * * * *

UNITED STATES PATENT AND TRADEMARK OFFICE
CERTIFICATE OF CORRECTION

PATENT NO. : 7,474,733 B1  
APPLICATION NO. : 09/890143  
DATED : January 6, 2009  
INVENTOR(S) : Masaki Yamamoto It is certified that error appears in the above-identified patent and that said Letters Patent is hereby corrected as shown below:

Column 11, Line 61, change "share" to --shape--.

Column 12, Line 65, after "is" insert --a--.

Column 13, Line 24, change "comprising;" to --comprising:--.

Column 14, Line 19, after "is" insert --a--.

Column 14, Line 37, after "aberration" insert --of--.

Signed and Sealed this

Twenty-fourth Day of March, 2009

JOHN DOLL  
*Acting Director of the United States Patent and Trademark Office*